United States Patent
Sim et al.

(10) Patent No.: US 6,423,654 B1
(45) Date of Patent: Jul. 23, 2002

(54) METHOD OF MANUFACTURING A SEMICONDUCTOR DEVICE HAVING SILICON OXYNITRIDE PASSAVATION LAYER

(75) Inventors: Sung-Min Sim, Suwon-shi; Young-Goan Jang, Seoul, both of (KR)

(73) Assignee: Samsung Electronics, Co., Ltd. (KR)

( * ) Notice: Subject to any disclaimer, the term of this patent is extended or adjusted under 35 U.S.C. 154(b) by 0 days.

(21) Appl. No.: 09/499,955

(22) Filed: Feb. 8, 2000

(30) Foreign Application Priority Data

Feb. 8, 1999 (KR) .............................. 99-4215

(51) Int. Cl.[7] ............................ H01L 21/469
(52) U.S. Cl. .................. 438/791; 438/151; 438/909
(58) Field of Search .................. 438/791, 151, 438/762, 771, 591, 909, 901, 675; 257/675

(56) References Cited

U.S. PATENT DOCUMENTS

| 3,765,935 A | * 10/1973 | Rand et al. |
| 3,883,889 A | 5/1975 | Hall |
| 4,331,737 A | 5/1982 | Nishizawa et al. |
| 4,416,952 A | 11/1983 | Nishizawa et al. |
| 4,436,770 A | 3/1984 | Nishizawa et al. |
| 4,717,631 A | 1/1988 | Kaganowicz et al. |
| 4,907,064 A | * 3/1990 | Yamazaki et al. |
| 5,620,910 A | * 4/1997 | Teramoto .................. 438/151 |

* cited by examiner

*Primary Examiner*—David Nelms
*Assistant Examiner*—Dung A Le
(74) *Attorney, Agent, or Firm*—Cantor Colburn LLP

(57) ABSTRACT

There is provided a semiconductor device having a silicon oxynitride passivation layer and a fabrication method thereof. The passivation layer is formed of a silicon oxynitride having a dielectric constant of 5.0–6.0 and an atomic composition ratio of silicon (25–40%), oxygen (25–40%), and nitrogen (25–40%). Therefore, the passivation layer has a low dielectric constant and is highly moisture-resistant to thereby reduce the parasitic capacitance between metal wiring layers.

7 Claims, 2 Drawing Sheets

METHOD OF MANUFACTURING A SEMICONDUCTOR DEVICE HAVING SILICON OXYNITRIDE PASSAVATION LAYER

BACKGROUND OF THE INVENTION

1. Field of the Invention

The present invention relates to a semiconductor device and a fabrication method thereof, and more particularly, to a semiconductor device having a silicon oxynitride passivation layer and a fabrication method thereof.

2. Description of the Related Art

As a multilayer metallization process has been put to practical use for a semiconductor device, an intermetal dielectric (IMD) film and a passivation layer on top of a wafer become significant. The IMD film should be formed of a material having a low dielectric constant and have an excellent step coverage in order to reduce the parasitic capacitance between metal wiring layers.

The passivation layer is used to prevent physical and chemical damages to a top metal wiring layer during an assembly and packaging process. This passivation layer is formed (i) by depositing a phosphorous (P)-doped oxide, for example, phosphosilicate glass (PSG), at a low temperature by chemical vapor deposition (CVD), (ii) by depositing an oxide by plasma-enhanced CVD (PECVD), or (iii) by depositing a silicon nitride (SiN) by PECVD.

If the passivation layer is formed of PSG, P contained in the PSG reduces stresses and thus cracks, and improves gettering characteristics of the passivation layer against natrium (Na) ions and other metal contaminants. However, a metal layer is susceptible to corrosion or moisture penetration depending on the amount of P contained in the passivation layer.

A PECVD-oxide passivation layer can reduce a mechanical stress and hydrogen content.

A PECVD-silicon nitride passivation layer functions as a barrier against mobile ions like Na ions and moisture and protects a chip from scratching. Yet, the silicon nitride may result in cracks in the passivation layer in a subsequent heat treatment because of its high mechanical stress.

A passivation layer formed of the above materials, namely PSG, PECVD, or PECVD-silicon nitride, should satisfy the following requirements:

(1) the passivation layer should protect a chip from an external environment. That is, it should absorb all external impacts to allow the chip to reliably operate against packaging materials and a severe user environment. As semiconductor technology advances, it is further expected that a bare chip is to be used in a future package. Therefore, this particular requirement for the passivation layer is more impressing;

(2) the passivation layer should also protect a metal wiring layer. That is, it should prevent pattern shift caused by possible metal deformation and stresses during operating devices, especially prevent metal corrosion caused by chemical materials; and (3) the passivation layer should prevent a signal propagation delay caused by parasitic capacitance since a device line width becomes smaller. That is, it should have a low dielectric constant.

However, formation of a passivation layer of a material having a low dielectric constant results in the decrease of an adhesion strength to an underlying metal wiring layer or IMD layer, and the decrease of an elastic coefficient, and easy moisture penetration. In addition, the dielectric constant of the passivation layer becomes inconsistent with respect to an external environment, in particular, moisture according to the type of film used. Therefore, a high-speed operating device experiences a delay and thus performance deterioration due to the inconsistency of the dielectric constant of the passivation layer.

SUMMARY OF THE INVENTION

Therefore, an object of the present invention is to provide a semiconductor device having a passivation layer which exhibits a low dielectric constant and a high moisture resistance.

Another object of the present invention is to provide a method of fabricating a semiconductor device having a passivation layer which exhibits a low dielectric constant and a high moisture resistance.

To achieve the above object, there is provided a semiconductor device having a silicon oxynitride passivation layer and a fabrication method thereof. The passivation layer is formed of a silicon oxynitride having a dielectric constant of 5.0–6.0 and an atomic composition ratio of silicon (25–40%), oxygen (25–40%), and nitrogen (25–40%). Therefore, the passivation layer has a low dielectric constant and is highly moisture-resistant to thereby reduce the parasitic capacitance between metal wiring layers.

Preferably, the passivation layer is formed to a thickness of about 3000 Å.

To achieve another object of the present invention, there is provided a method of fabricating a semiconductor device having a passivation layer. A semiconductor substrate is loaded into a reaction chamber in an atmosphere of silane ($SiH_4$), nitrous oxide ($N_2O$), and ammonia ($NH_3$) gases. Then, a silicon oxynitride passivation layer is deposited on the semiconductor substrate by reacting the gases, so that the passivation layer has a dielectric constant of 5.0–6.0 and an atomic composition ratio of silicon (25–40%), oxygen (25–40%), and nitrogen (25–40%).

Preferably, the flow ratio of

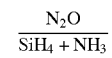

is between 0.5 and 1.2.

Preferably, the flow rates of the $SiH_4$, $N_2O$, and $NH_3$ gases are 100 to 1000 sccm, 1000 to 5000 sccm, and 1000 to 10000 sccm, respectively.

Preferably, the silicon oxynitride passivation layer is deposited at 250 to 450° C.

BRIEF DESCRIPTION OF THE DRAWINGS

The above objects and advantages of the present invention will become more apparent by describing in detail preferred embodiments thereof with reference to the attached drawings in which.

DETAILED DESCRIPTION OF THE PREFERRED EMBODIMENTS

Figure 1:
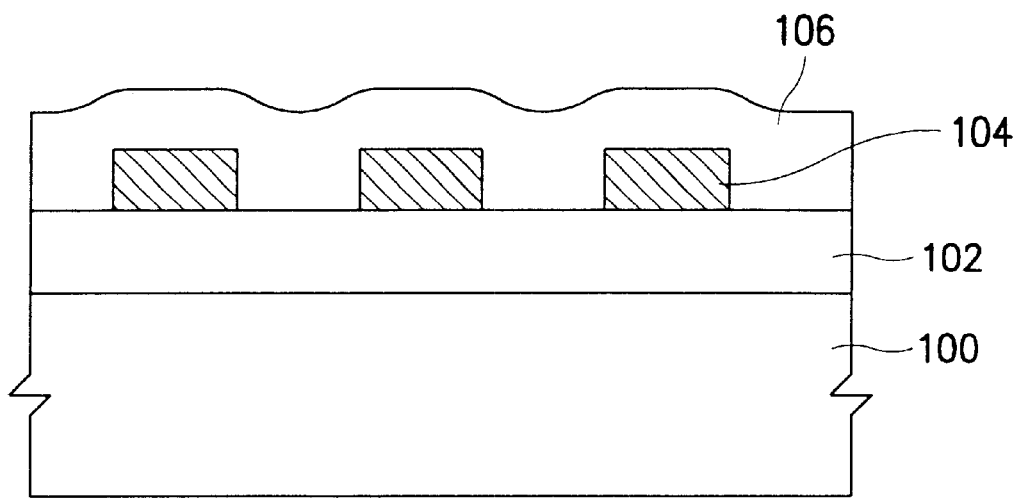
FIG. 1 is a sectional view of a semiconductor device according to a first embodiment of the present invention.

FIG. 1 is a sectional view of a semiconductor device according to a first embodiment of the present invention.

Referring to FIG. 1, an insulation layer 102 is deposited on a semiconductor substrate 100. Metal wiring layers 104 are formed into stripes by depositing aluminum (Al) on the insulation layer 102 by sputtering and patterning the Al by photolithography.

The semiconductor substrate 100 including the metal wiring layers 104 is loaded into a reaction chamber of a PECVD equipment. Then, the gases of silane ($SiH_4$), nitrous oxide ($N_2O$), and ammonia ($NH_3$) are introduced into the reaction chamber, and then a silicon oxynitride passivation layer 106 is deposited on the semiconductor substrate 100 to be about 3000 Å or thicker while the semiconductor substrate 100 is maintained at 250 to 450° C. Preferably, the silicon oxynitride passivation layer 106 is deposited with the flow rates of the $SiH_4$, $N_2O$, and $NH_3$ gases being from 100 to 1000 sccm (standard cubic centimeter per minute), 1000 to 5000 sccm, and 1000 to 10000 sccm, respectively.

The composition ratio of the silicon oxynitride passivation layer (film) 106 can vary by changing the flow rates of the $SiH_4$, $N_2O$, and $NH_3$ gases.

The composition ratios of the silicon oxynitride passivation layer 106 depending on the gas flow rates are listed in (table 1).

TABLE 1

| $\dfrac{N_2O}{SiH_4+NH_3}$ | Si atom % | O atom % | N atom % |
|---|---|---|---|
| #1: 0.56 | 38 | 27 | 35 |
| #2: 0.74 | 37 | 31 | 32 |
| #3: 0.93 | 37 | 34 | 29 |
| #4: 1.11 | 36 | 38 | 26 |

Here, a PECVD-deposited passivation layer contains hydrogen (H) (10–20%) but the hydrogen content has little influences on film characteristics.

From (table 1), it is noted that the content of N varies by 3% with an about 0.2 change in the flow ratio of $$\dfrac{N_2O}{SiH_4+NH_3}.$$

(Table 2) shows measurements of the dielectric constant of the silicon oxynitride film formed under the conditions listed in (table 1). That is, the table shows the dielectric constants of the silicon oxynitride films having the composition ratios of (table 1) as deposited and after a moisture absorption test at a temperature of 85° C., at a relative humidity (RH) of 85% for 96 hours.

TABLE 2

|  | #1 (0.56) | #2 (0.74) | #3 (0.93) | #4 (1.11) |
|---|---|---|---|---|
| initial measurements | 6.0 | 5.5 | 5.0 | 4.5 |
| moisture absorption at 85° C. and 85% RH for 96 hr | 8.2 | 5.8 | 5.5 | 5.2 | where the numeral in a blank represents the flow ratio of $$\dfrac{N_2O}{SiH_4+NH_3}.$$

Referring to (table 2), as long as the flow ratio of $$\dfrac{N_2O}{SiH_4+NH_3}$$

is maintained within the range of 0.5 to 1.2, a silicon oxynitride film has a dielectric constant as stable and low as 5.0 to 6.0. Therefore, it is preferable to form a silicon oxynitride film to have an atomic composition ratio of silicon (25–40%), oxygen (25–40%), and nitrogen (25–40%).

From the moisture absorption test of silicon oxynitride films formed with the composition ratios shown in (table 1) at a high temperature and high humidity environment, for example, at 121° C., 2 Torr, and 85% RH for 1000 hr, it was observed that moisture was penetrated into the silicon oxynitride films formed under the conditions #1, #2, and #3 upto a thickness of about 2000 Å, and into the silicon oxynitride film formed under the condition #4 to a thickness of about 3000 Å or above. Accordingly, the silicon oxynitride film as a passivation layer should be formed to be at least about 3000 Å thick.

Figure 2:
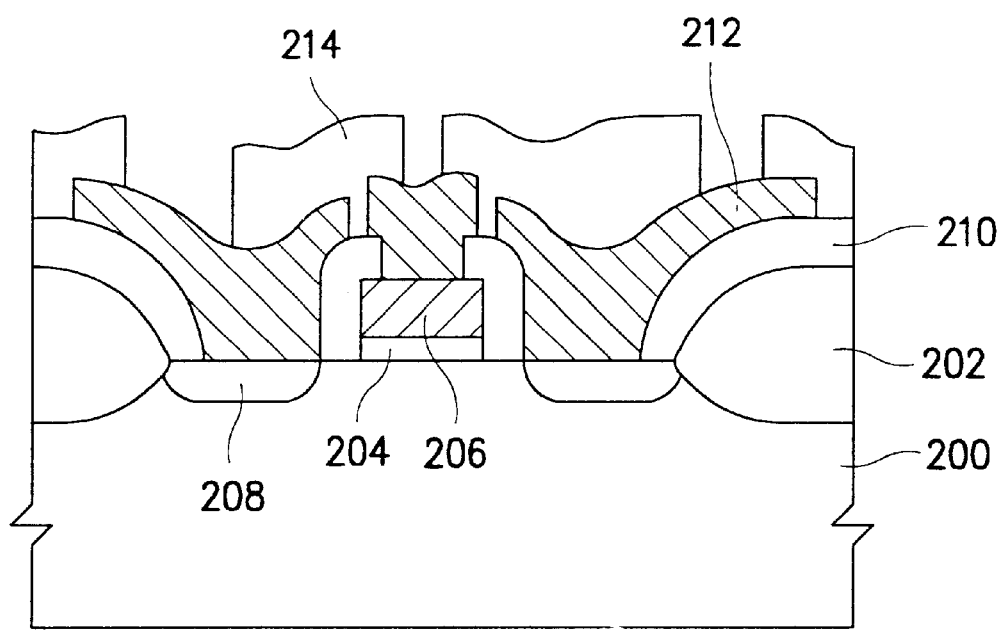
FIG. 2 is a sectional view of a semiconductor device according to a second embodiment of the present invention.

FIG. 2 is a sectional view of an N-channel MOS (Metal Oxide Semiconductor) transistor having a silicon oxynitride film as a passivation layer according to a second embodiment of the present invention.

Referring to FIG. 2, an active region and a field region are defined on a P-type semiconductor substrate 200 by a field oxide film 202. After a gate insulation layer 204 is formed on the active region by thermal oxidation, a polysilicon layer 206 is formed on the gate insulation layer 204 by CVD using $SiH_4$ gas as a source gas. The polysilicon layer 206 is doped with P by depositing $POCl_3$, and then patterned into a gate electrode by photolithography. The polysilicon can be replaced with polycide which comprises a stack of polysilicon and a metal silicide as a gate electrode material. Subsequently, an $N^+$ source/drain region 208 is formed by implanting arsenic (As) ions into the P-type semiconductor substrate 200 in self-alignment using the gate electrode 206 as a mask.

An insulation layer 210 is formed by depositing a silicon oxide on the resultant structure by CVD, and contact holes are formed to open the gate electrode 206 and the source/drain region 208 by subjecting the insulation layer 210 to reactive ion etching (RIE). Then, a metal wiring layer 212 is formed by depositing Al on the resultant structure by sputtering and patterning the Al by photolithography. The metal wiring layer 212 is electrically connected to the gate electrode 206 and the source/drain region 208 of the transistor through the contact holes formed into the insulation layer 210.

Thereafter, the semiconductor substrate 200 is loaded into a reaction chamber of a PECVD equipment, the gases of $SiH_4$, $N_2O$, and $NH_3$ are introduced into the reaction chamber, the semiconductor substrate 200 is maintained at 250 to 450° C., and then a silicon oxynitride passivation layer 214 is deposited to fully cover the metal wiring layer 210 to a thickness of about 3000 Å. Preferably, the respective flow rates of the $SiH_4$, $N_2O$, and $NH_3$ gases are 250, 2500, and 2500 sccm. Under this condition, the flow ratio of $$\dfrac{N_2O}{SiH_4+NH_3}$$

is about 0.9. Thus, the highly moisture-resistant silicon oxynitride passivation layer 214 having a dielectric constant of 5.0 to 6.0 can be formed.

Figure 3:
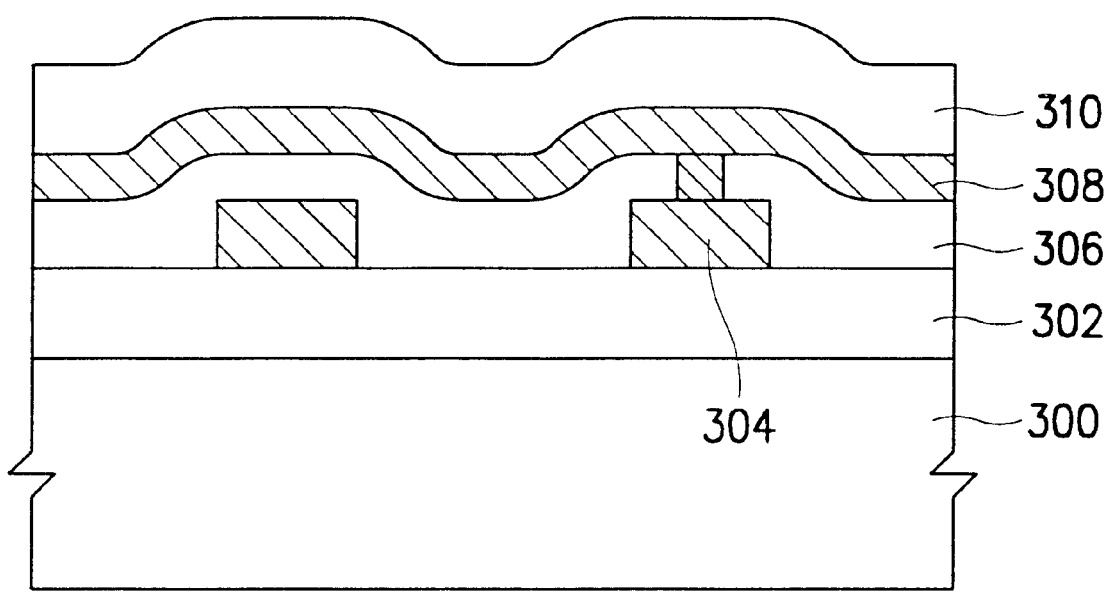
FIG. 3 is a sectional view of a semiconductor device according to a third embodiment of the present invention.

FIG. 3 is a sectional view of a semiconductor device having a multilayer metal interconnect structure according to a third embodiment of the present invention.

Referring to FIG. 3, an insulation layer 302 is formed of a silicon oxide by CVD on a semiconductor substrate 300 having a plurality of circuit areas formed thereon, and then a first metal wiring layer 304 is formed by depositing Al by sputtering and patterning the Al by photolithography.

Subsequently, the gases of $SiH_4$, $N_2O$, and $NH_3$ are introduced into a reaction chamber of a PECVD equipment, and an IMD layer 306 is formed of a silicon oxynitride to fully cover the first metal wiring layer 304 while the semiconductor substrate 300 is maintained at 250 to 450° C.

Then, a via hole (not shown) is formed to open the first metal wiring layer 304 by subjecting the silicon oxynitride IMD layer 306 to RIE. A second metal wiring layer 308 is formed by depositing Al on the resultant structure by sputtering and patterning the Al by photolithography. The second metal layer 308 is electrically connected to the first metal wiring layer 304 through the via hole.

Thereafter, the gases of $SiH_4$, $N_2O$, and $NH_3$ are introduced into the reaction chamber of the PECVD equipment, and a silicon oxynitride passivation layer 310 is formed to fully cover the second metal wiring layer 308 while the semiconductor substrate 300 is maintained at 250 to 450° C. Preferably, the silicon oxynitrdie layer 310 and the silicon oxynitride IMD layer 306 have the same composition ratio. That is, the silicon oxynitride layer 310 and the silicon oxynitride IMD layer 306 have the atomic composition ratio of silicon (25–40%), oxygen (25–40%), and nitrogen (25–40%) and a stable and low dielectric constant of 5.0 to 6.0 by setting the flow ratio of $$\frac{N_2O}{SiH_4 + NH_3}$$

to 0.5 to 1.2.

In accordance with the present invention, a silicon oxynitride passivation layer has a dielectric constant as low as 5.0 to 6.0. The silicon oxynitride exhibits a lower stress than a silicon nitride and substantially functions as a barrier against mobile ions like Na and moisture. Therefore, such a highly moisture-resistant and a low dielectric constant passivation layer as can reduce the parasitic capacitance between metal wiring layers can be achieved.

While the present invention has been described in detail with reference to the specific embodiments, they are mere exemplary applications. Thus, it is to be clearly understood that many variations can be made by anyone skilled in the art within the scope and spirit of the present invention.

What is claimed is:

1. A method of fabricating a semiconductor device having a passivation layer, comprising:

loading a semiconductor substrate into a reaction chamber in an atmosphere of silane ($SiH_4$), nitrous oxide ($N_2O$), and ammonia ($NH_3$) gases; and depositing a silicon oxynitride passivation layer on the semiconductor substrate by reacting the gases, so that the passivation layer has a dielectric constant of 5.0–6.0 and an atomic composition ratio of silicon (25–40%), oxygen (25–40%), and nitrogen (25–40%).

2. The method of claim 1, wherein the flow ratio of $$\frac{N_2O}{SiH_4 + NH_3}$$

is between 0.5 and 1.2.

3. The method of claim 1, wherein the flow rates of the $SiH_4$, $N_2O$, and $NH_3$ gases are 100 to 1000 sccm, 1000 to 5000 sccm, and 1000 to 10000 sccm, respectively.

4. The method of claim 1, wherein the silicon oxynitride passivation layer is deposited at 250 to 450° C.

5. A method of fabricating a semiconductor device having a passivation layer, comprising:

loading a semiconductor substrate into a reaction chamber in an atmosphere of silane ($SiH_4$), nitrous oxide ($N_2O$), and ammonia ($NH_3$) gases; and depositing a silicon oxynitride passivation layer on the semiconductor substrate by reacting the gases, so that the passivation layer has a dielectric constant of 5.0–6.0 and an atomic composition ratio of silicon (25–40%), oxygen (25–40%), and nitrogen (25–40%) the silicon oxynitride passivation layer being deposited about 3000 Å or thicker.

6. The method of claim 1, wherein the reaction chamber is part of a PECVD (plasma-enhanced chemical vapor deposition) assembly.

7. A method of fabricating a semiconductor device having a passivation layer, comprising:

loading a semiconductor substrate into a reaction chamber in an atmosphere of silane ($SiH_4$), nitrous oxide ($N_2O$), and ammonia ($NH_3$) gases; and depositing a silicon oxynitride passivation layer on the semiconductor substrate by reacting the gases, so that the passivation layer has a dielectric constant of 5.0–6.0 and an atomic composition ratio of silicon (25–40%), oxygen (25–40%), and nitrogen (30<nitrogen<38%) the silicon oxynitride passivation layer being deposited about 3000 Å or thicker.

* * * * *